US008895356B2

(12) United States Patent
Maeng et al.

(10) Patent No.: US 8,895,356 B2
(45) Date of Patent: Nov. 25, 2014

(54) CHEMICAL VAPOR DEPOSITION APPARATUS AND METHOD OF FORMING SEMICONDUCTOR EPITAXIAL THIN FILM USING THE SAME

(75) Inventors: Jong Sun Maeng, Gwangju (KR); Young Sun Kim, Gyunggi-do (KR); Hyun Wook Shim, Gyunggi-do (KR); Sung Tae Kim, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 409 days.

(21) Appl. No.: 13/173,423

(22) Filed: Jun. 30, 2011

(65) Prior Publication Data

US 2012/0009697 A1 Jan. 12, 2012

(30) Foreign Application Priority Data

Jul. 12, 2010 (KR) ........................ 10-2010-0066925

(51) Int. Cl.
H01L 21/00 (2006.01)
H01L 21/16 (2006.01)
C23C 16/455 (2006.01)
C23C 16/458 (2006.01)

(52) U.S. Cl.
CPC ..... *C23C 16/45502* (2013.01); *C23C 16/45572* (2013.01); *C23C 16/45578* (2013.01); *C23C 16/458* (2013.01); *C23C 16/45517* (2013.01); *C23C 16/4558* (2013.01); *C23C 16/4585* (2013.01); *C23C 16/45563* (2013.01); *C23C 16/4584* (2013.01); *C23C 16/45591* (2013.01); *C23C 16/45574* (2013.01)
USPC ...... 438/104; 438/26; 257/E33.056; 118/728; 118/730

(58) Field of Classification Search
USPC .......... 438/26–46, 680, 758; 257/13, 94–103, 257/E21.293, E33.056; 118/663, 715–730
See application file for complete search history.

(56) References Cited

U.S. PATENT DOCUMENTS 4,745,088 A 5/1988 Inoue et al.
6,899,764 B2 5/2005 Frijlink
(Continued)

FOREIGN PATENT DOCUMENTS

CN 2596557 Y 12/2003
CN 101521228 A 9/2009
(Continued)

OTHER PUBLICATIONS

Korean Office Action, w/ English translation thereof, issued in Korean Patent Application No. KR 10-2010-0066925 dated Apr. 29, 2013.

(Continued)

*Primary Examiner* — Charles Garber
*Assistant Examiner* — Abdulfattah Mustapha
(74) *Attorney, Agent, or Firm* — McDermott Will & Emery LLP

(57) ABSTRACT

A chemical vapor deposition apparatus includes: a reaction chamber including an inner tube having a predetermined volume of an inner space, and an outer tube tightly sealing the inner tube; a wafer holder disposed within the inner tube and on which a plurality of wafers are stacked at predetermined intervals; and a gas supply unit including at least one gas line supplying an external reaction gas to the reaction chamber, and a plurality of spray nozzles communicating with the gas line to spray the reaction gas to the wafers, whereby semiconductor epitaxial thin films are grown on the surfaces of the wafers, wherein the semiconductor epitaxial thin film grown on the surface of the wafer includes a light emitting structure in which a first-conductivity-type semiconductor layer, an active layer, and a second-conductivity-type semiconductor layer are sequentially formed.

19 Claims, 15 Drawing Sheets

(56) References Cited

U.S. PATENT DOCUMENTS

| | | |
|---|---|---|
| 2005/0287806 A1 | 12/2005 | Matsuura |
| 2006/0021574 A1 | 2/2006 | Armour et al. |
| 2006/0054919 A1* | 3/2006 | Matsuda et al. ............. 257/103 |
| 2006/0258157 A1 | 11/2006 | Weimer |
| 2007/0034857 A1 | 2/2007 | Song |
| 2007/0243652 A1 | 10/2007 | Bour et al. |
| 2009/0197424 A1* | 8/2009 | Sakai et al. .................. 438/758 |
| 2009/0212320 A1 | 8/2009 | Kim et al. |
| 2009/0230442 A1 | 9/2009 | Kim et al. |
| 2010/0154711 A1* | 6/2010 | Ishibashi et al. ............. 118/725 |
| 2010/0207147 A1* | 8/2010 | Kim ................................ 257/98 |

FOREIGN PATENT DOCUMENTS

| | | |
|---|---|---|
| CN | 101552287 A | 10/2009 |
| JP | 2007-053372 A | 3/2007 |
| JP | 2008-311500 A | 12/2008 |
| KR | 10-2006-0048480 | 5/2006 |
| KR | 100828664 B1 * | 9/2008 |
| KR | 10-0865114 B1 | 10/2008 |
| TW | 200702483 | 1/2007 |
| WO | WO 2010/120850 A1 | 10/2010 |

OTHER PUBLICATIONS

Chinese Office Action with English translation issued in Chinese Application No. 201110199158.2 mailed Jun. 28, 2012.

Extended European Search Report issued in European Patent Application No. 11173168.3, dated Mar. 27, 2012.

Taiwanese Office Action issued in Taiwanese Application No. 100120650 dated Mar. 14, 2014.

Partial European Search Report issued in European Patent Application No. 11173168.3, dated Oct. 27, 2011.

* cited by examiner

CHEMICAL VAPOR DEPOSITION APPARATUS AND METHOD OF FORMING SEMICONDUCTOR EPITAXIAL THIN FILM USING THE SAME

CROSS-REFERENCE TO RELATED APPLICATIONS

This application claims the priority of Korean Patent Application No. 10-2010-0066925 filed on Jul. 12, 2010, in the Korean Intellectual Property Office, the disclosure of which is incorporated herein by reference.

BACKGROUND OF THE INVENTION

1. Field of the Invention

The present invention relates to a chemical vapor deposition apparatus and a method of forming a semiconductor epitaxial thin film using the same, and more particularly, to a chemical vapor deposition apparatus, which can grow thin films on both surfaces of a substrate using a metal organic compound, and a method of forming a semiconductor epitaxial thin film using the chemical vapor deposition apparatus.

2. Description of the Related Art

The demand for nitride-based (GaAlInN) light emitting devices (LEDs) is increasing explosively. The nitride-based LEDs are used in portable phone keypads, liquid crystal display (LCD) windows, TV backlight units (BLUs), and illumination apparatuses. To meet this trend, research has been conducted as to introduce a large-diameter sapphire wafer. In other words, the diameter of the sapphire wafer used to grow nitride or semiconductor oxide (e.g., GaN, ZnO, etc.), which is applicable to LEDs, to an epitaxial thin film increases from 4 inches to 6 inches.

A current chemical vapor deposition process can manufacture about 10 sheets of 4-inch sapphire wafers at a time, but it has a disadvantage in that there is a limit to the mass production thereof due to a structure of a susceptor which supports the sapphire wafer.

In addition, a large-diameter wafer has a limit on use due to a degradation of performance, such as a wafer bowing effect or cracking. The wafer bowing effect or cracking may occur due to a high thermal stress, which is caused by a great difference in thermal expansion coefficients between a nitride semiconductor and a sapphire wafer used as a growth substrate, and an inherent stress, which is caused by a difference of a lattice constant during a thin film growth.

SUMMARY OF THE INVENTION

An aspect of the present invention provides a chemical vapor deposition apparatus, which can grow hundreds of sheets of wafers at a time to thereby realize the mass production thereof, and a method of forming a semiconductor epitaxial thin film using the chemical vapor deposition apparatus.

An aspect of the present invention also provides a chemical vapor deposition apparatus, which can suppress a wafer bowing effect caused by a difference of a thermal stress and prevent a damage of a wafer by growing a thin film on a single surface of a wafer, whereby it can be used for a large-diameter wafer, and a method of forming a semiconductor epitaxial thin film using the chemical vapor deposition apparatus.

According to an aspect of the present invention, there is provided a chemical vapor deposition apparatus including: a reaction chamber including an inner tube having a predetermined volume of an inner space, and an outer tube tightly sealing the inner tube; a wafer holder disposed within the inner tube and on which a plurality of wafers are stacked at predetermined intervals; and a gas supply unit including at least one gas line supplying an external reaction gas to the reaction chamber, and a plurality of spray nozzles communicating with the gas line to spray the reaction gas to the wafers, whereby semiconductor epitaxial thin films are grown on the surfaces of the wafers, wherein the semiconductor epitaxial thin film grown on the surface of the wafer includes a light emitting structure in which a first-conductivity-type semiconductor layer, an active layer, and a second-conductivity-type semiconductor layer are sequentially formed.

The gas supply unit may extend vertically in a wafer stacking direction, and the plurality of spray nozzles may be arranged corresponding to the stacking intervals of the wafers, such that the spray nozzles face the sides of the stacked wafers.

The gas supply unit may extend vertically in a wafer stacking direction, and the plurality of spray nozzles may be arranged between the stacked wafers.

The gas supply unit may further include a cooling line provided around the gas line to allow a coolant to flow therethrough in order to cool the reaction gas.

The gas supply unit may include a first gas line supplying a first reaction gas and a second gas line supplying a second reaction gas, the first gas line and the second gas line being disposed within the cooling line.

One or more gas supply units may be provided to supply the same reaction gas or separately supply different reaction gases.

The gas supply unit may further include an auxiliary line which communicates with the gas line and the cooling line and sprays the reaction gas, the auxiliary line being disposed horizontally around the periphery of the wafers to surround the wafers.

The auxiliary line may have a ring shape having a diameter greater than that of the wafer, the auxiliary line may include: an auxiliary gas line including a plurality of spray nozzles which communicate with the gas line and spray the reaction gas supplied from the gas line; and an auxiliary cooling line provided around the auxiliary gas line to communicate with the cooling line 32 and allow a coolant to flow therethrough in order to cool the reaction gas.

The auxiliary line may include a first auxiliary gas line supplying a first reaction gas, and a second auxiliary gas line supplying a second reaction line.

The auxiliary line may be disposed between the stacked wafers or arranged corresponding to the stacking intervals of the wafers to face the sides of the wafers.

The chemical vapor deposition apparatus may further include a guide unit guiding the flow of the reaction gas so that the reaction gas sprayed from the spray nozzles flows to the top and bottom surfaces of the respective wafers.

The guide unit may be disposed between the spray nozzles and the wafers has an upper inclined surface and a lower inclined surface which are inclined toward the spray nozzles and contacted together in order to reduce a cross-sectional area in a direction from the wafers toward the spray nozzles.

The guide unit may be vertically arranged corresponding to the stacking intervals of the wafers to face the sides of the stacked wafers.

The guide unit may be vertically arranged corresponding to the stacking intervals of the wafers to face a space between the stacked wafers and the wafers.

The guide unit may extend from the wafer holder toward the spray nozzles and be arranged vertically in a wafer stacking direction.

The guide unit may be arranged vertically in a wafer stacking direction by at least one pair of support pins and be detachably mounted on the wafer holder to face the spray nozzles.

The chemical vapor deposition apparatus may further include a rotation driving unit connected to the wafer holder to rotate the wafer holder.

The light emitting structure may further include a first electrode formed on the first-conductivity-type semiconductor layer, and a second electrode formed on the second-conductivity-type semiconductor layer.

The first electrode may be formed on the first-conductivity-type semiconductor layer, a portion of which is exposed by mesa etching, and the second electrode may be formed on a transparent electrode layer which is formed on the second-conductivity-type semiconductor layer.

According to another aspect of the present invention, there is provided a method of forming a semiconductor epitaxial thin film, including: stacking and mounting a plurality of wafers on a wafer holder at predetermined intervals, and loading the wafer holder into an inner tube of a reaction chamber, the reaction chamber including the inner tube having an inner space and an outer tube tightly sealing the inner tube; spraying an external reaction gas to the wafers through a gas supply unit which extends between the inner tube and the wafer holder vertically in a wafer stacking direction; and allowing the reaction gas sprayed from the gas supply unit to flow to the surfaces of the wafers, thereby growing a semiconductor epitaxial thin film on the surfaces of the wafers, wherein the semiconductor epitaxial thin film grown on the surface of the wafer is sequentially grown to be a first-conductivity-type semiconductor layer, an active layer, and a second-conductivity-type semiconductor layer, thereby forming a light emitting structure.

The loading of the wafer holder into the inner tube may further include providing a plurality of guide units arranged at predetermined intervals in a direction vertical to the wafer holder.

In the providing of the plurality of guide units, the guide units may be vertically arranged corresponding to the stacking intervals of the wafers to face the sides of the stacked wafers or to face a space between the stacked wafers.

In the spraying of the reaction gas to the wafer, the gas supply unit may include at least one gas line supplying the reaction gas to the reaction chamber, and a plurality of spray nozzles communicating with the gas line to spray the reaction gas to the wafers.

The plurality of spray nozzles may be arranged corresponding to the stacking intervals of the wafers, such that the spray nozzles face the sides of the stacked wafers or the spray nozzles are arranged between the stacked wafers.

The gas supply unit may further include a cooling line provided around the gas line to allow a coolant to flow therethrough in order to cool the reaction gas.

One or more gas supply units may be provided to supply the same reaction gas or separately supply different reaction gases.

The growing of the semiconductor epitaxial thin film may further include forming a first electrode and a second electrode on the first-conductivity-type semiconductor layer and the second-conductivity-type semiconductor layer, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
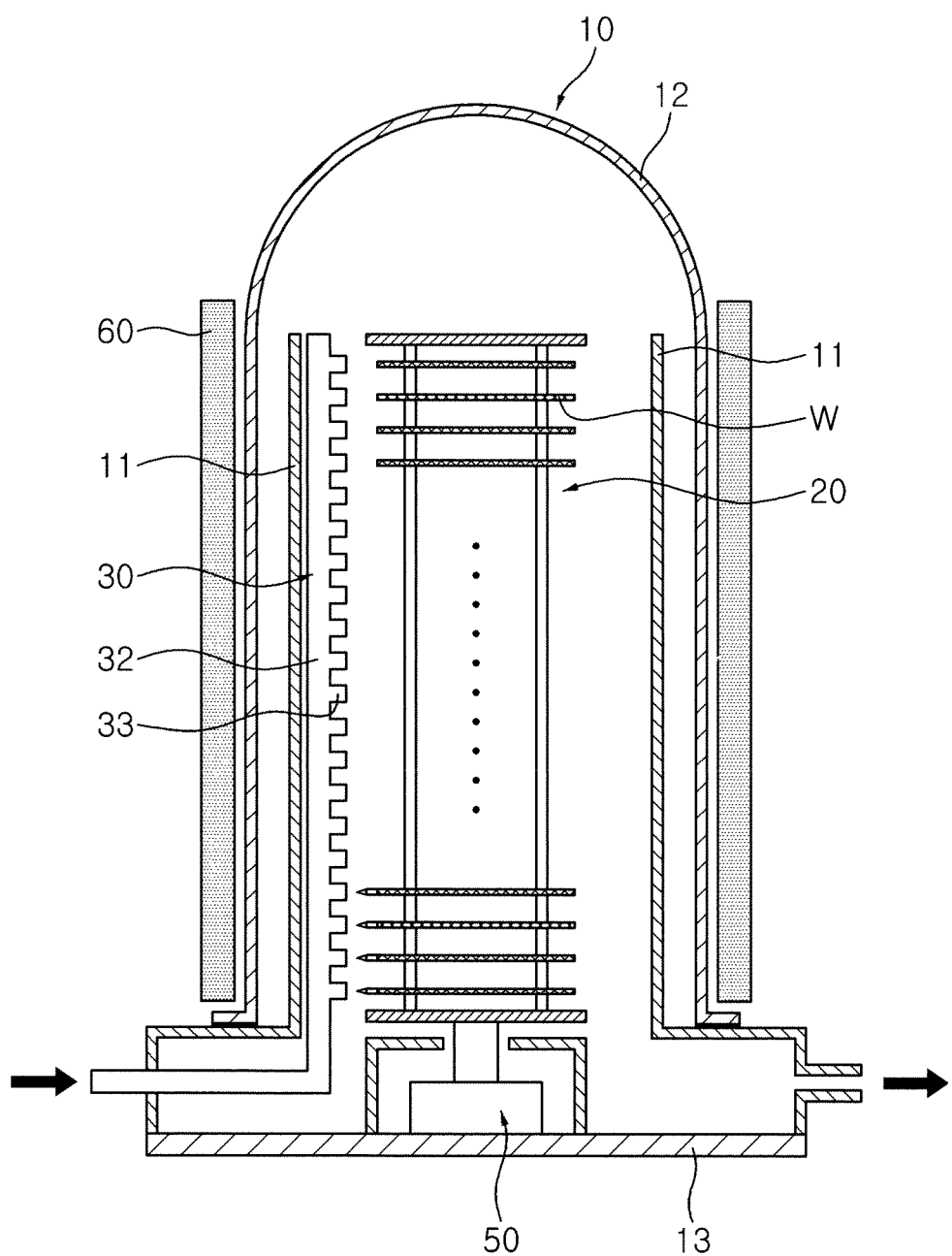
FIG. 1 is schematic cross-sectional view illustrating a chemical vapor deposition apparatus according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

A chemical vapor deposition apparatus according to an embodiment of the present invention will be described below with reference to FIGS. 1 through 5.

Figure 2:
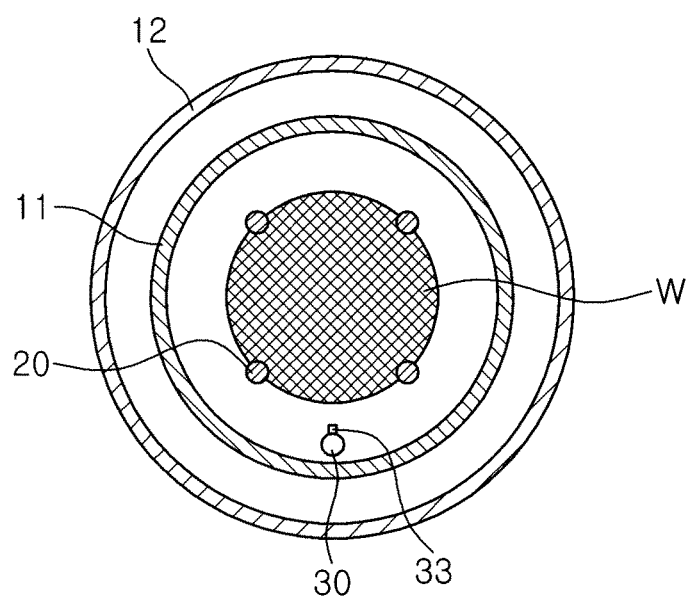
FIG. 2 is a schematic plan view illustrating the chemical vapor deposition apparatus of FIG. 1.
Figure 3:
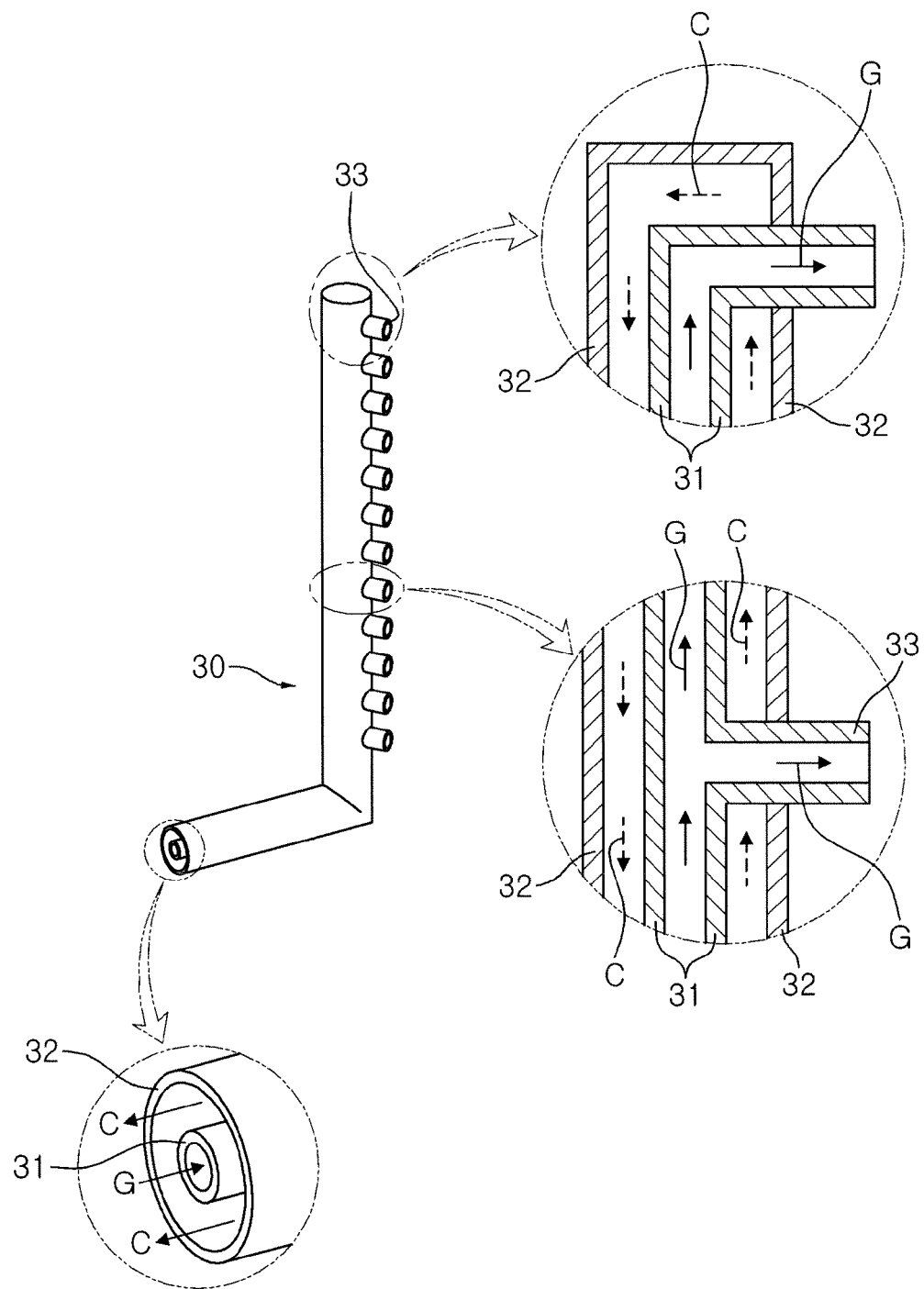
FIG. 3 is a schematic view illustrating a gas supply unit of FIG. 1.
Figure 4A:
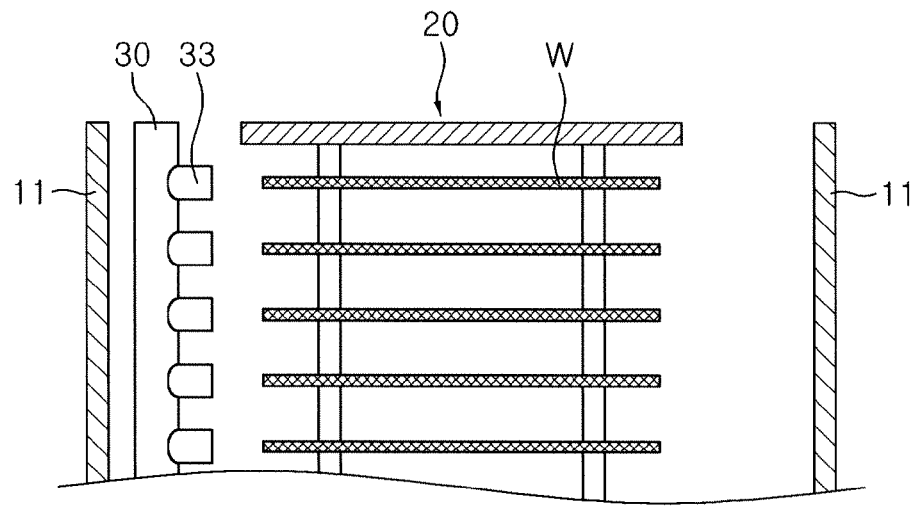
FIGS. 4A and 4B are cross-sectional views illustrating an arrangement of spray nozzles of the gas supply unit with respect to loaded wafers.
Figure 4B:
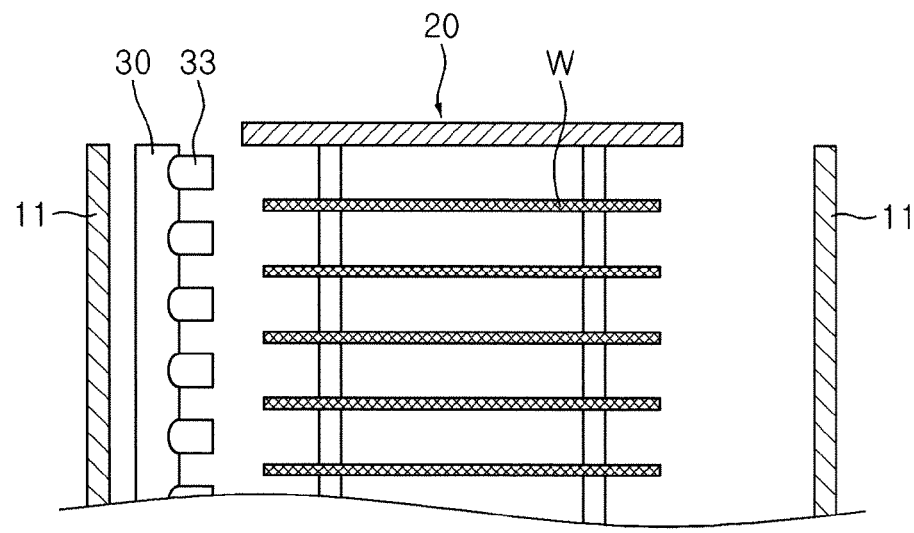

FIG. 1 is schematic cross-sectional view illustrating a chemical vapor deposition apparatus according to an embodiment of the present invention. FIG. 2 is a schematic plan view illustrating the chemical vapor deposition apparatus of FIG. 1. FIG. 3 is a schematic view illustrating a gas supply unit of FIG. 1. FIGS. 4A and 4B are cross-sectional views illustrating an arrangement of spray nozzles of the gas supply unit with respect to loaded wafers. FIGS. 5A through 5D are schematic cross-sectional view illustrating a principle of depositing a thin film on each wafer through the gas supply unit.

Referring to FIGS. 1 through 3, the chemical vapor deposition apparatus 1 according to the embodiment of the present invention includes a reaction chamber 10, a wafer holder 20, and a gas supply unit 30. The chemical vapor deposition apparatus 11 may further include a rotation driving unit 50 connected to the wafer holder 20 and rotating the wafer holder 20. The chemical vapor deposition apparatus 1 may further include a heating unit 60 provided around the reaction chamber 10 and heating the inside of the reaction chamber 10. The reaction chamber 10 can maintain high temperature uniformity through the heating unit 60.

The reaction chamber 10 has a dual structure with an inner tube 11 and an outer tube 12. The inner tube 11 has a cylindrical structure having a predetermined volume of an inner space and having opened upper and lower portions. The outer tube 12 tightly seals the inner tube 11 and has an opened lower portion. The lower portion of the inner tube 11 is provided to allow a base plate 13 to be opened and closed. The inner tube 11, the outer tube 12, and the base plate 13 may be made of quartz or silicon carbide (SiC).

The wafer holder 20 is provided so that a plurality of wafers W for thin film growth are stacked at predetermined intervals. The wafer holder 20 in which the wafers W are stacked may be loaded into or unloaded from the inner tube 11 through the opening/closing of the base plate 13. The wafer holder 20 may be made of quartz or the like so that it is not thermally deformed within the reaction chamber 10 in a high-temperature and high-pressure atmosphere; however, the invention is not limited thereto.

As such, since hundreds of sheets of wafers W are stacked in the wafer holder 20 at predetermined intervals, mass production thereof can be realized as compared to a conventional art in which a few sheets of wafers W are mounted on the susceptor and grown.

The wafer holder 20 is connected to the rotation driving unit 50 protected by a heat insulation plate and is rotated within the inner tube 11 at a predetermined speed by a torque applied from the rotation driving unit 50. Therefore, an epitaxial thin film 80 can be grown more uniformly on the entire surface of the wafer W.

The gas supply unit 30 includes at least one gas line 31 and a plurality of spray nozzles 33. The gas line 31 supplies reaction gas G from the outside to the inside of the reaction chamber 10 so that a semiconductor epitaxial thin film is grown on the surfaces of the wafers W. The plurality of spray nozzles 33 communicate with the gas line 31 and spray the reaction gas G toward the wafers W. The gas supply unit 30 may further include a cooling line 32 provided around the gas line 31 to cool the reaction gas G.

Specifically, the gas supply unit 30 including the gas line 31 and the cooling gas 32 extends between the inner tube 11 and the wafer holder 20 vertically in a wafer W stacking direction. The gas supply unit 30 has a dual structure in which the gas line 31 is disposed inside the cooling line 32. That is, the gas line through which the reaction gas G flows is surrounded by the cooling line 32 through which a coolant C flows, so that the reaction gas G is cooled by the coolant C. Hence, it is possible to prevent the reaction gas G from being reacted and deposited on the inside of the gas line 31 while it is being supplied to the reaction chamber 10 along the gas line 31 under a high-temperature atmosphere.

The reaction gas G is used in a form of a nitride semiconductor alloy (Ga(Al, In)N) and doping source. For example, the reaction gas G may include TMGa, TEGa, TMIn, TMAl, $SiH_4$, $Cp_2Mg$, DEZn, $NH_3$, $H_2$, $N_2$, etc. In addition, the reaction gas G is used in a form of an oxide semiconductor alloy (Zn(Cd, Mg)O) and doping source. For example, the reaction gas G may include DEZn, TMGa, TMIn, TMAl, $Cd[(EPiPr_2)_2N]_2$ (E=S, Se), TMSb, $Cp_2Mg$, $N_2$, Ar, $O_2$, $N_2O$, $O_3$, etc.

The plurality of spray nozzles 33 protrude from the surface of the cooling line 32 in a length direction of the gas supply unit 30, specifically, the cooling line 32, and are provided at positions corresponding to those of the respective wafers W. The plurality of spray nozzles 33 communicate with the gas line 31.

As illustrated in FIG. 4A, the plurality of spray nozzles 33 may be arranged corresponding to the stacking intervals of the wafers W to face the sides of the stacked wafers W. In addition, as illustrated in FIG. 4B, the plurality of spray nozzles 33 may be arranged between the stacked wafers W. Through such a structure, the spray nozzles 33 spray the reaction gas G to the surfaces of the respective wafers W so that the epitaxial thin film 80 is formed on the surfaces of the respective wafers W.

Figure 5A:
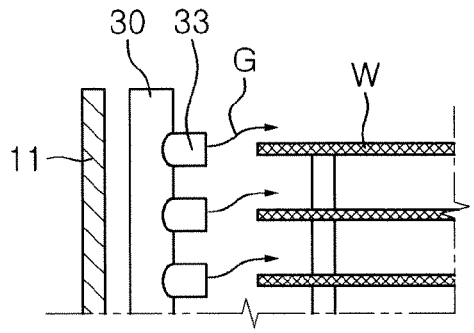
FIGS. 5A through 5D are schematic cross-sectional views illustrating a principle of depositing a thin film on each wafer through the gas supply unit.
Figure 5B:
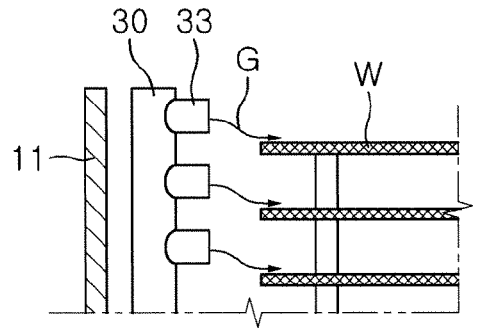
Figure 5C:
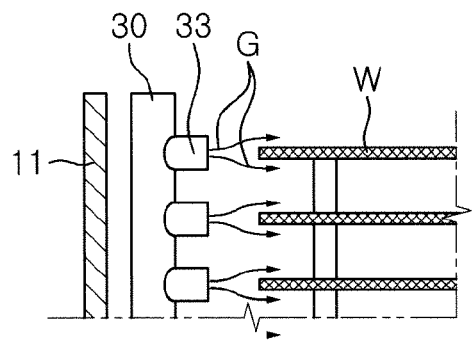
Figure 5D:
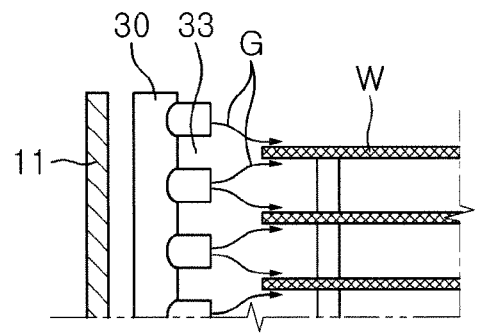

Specifically, as illustrated in FIGS. 5A and 5B, the spray nozzles 33 may be arranged to spray the reaction gas G to a single side of each wafer W, that is, the top surface thereof, so that the epitaxial thin film 80 is formed on only the top surface of each wafer W. In addition, as illustrated in FIGS. 5C and 5D, the spray nozzles 33 may be arranged to spray the reaction gas G to the top and bottom surfaces of each wafer W so that the epitaxial thin films 80 are simultaneously formed on the top and bottom surfaces of each wafer W. That is, the plurality of spray nozzles 33 may be arranged corresponding to the stacked wafers W to spray the reaction gas G to the top and bottom surfaces of each wafer W, so that the epitaxial thin films 80 are grown on the top and bottom surfaces of each wafer W.

As such, when the epitaxial thin films 80 are formed on the top and bottom surfaces of each wafer W, a light emitting structure 80' configured with two epitaxial thin films can be obtained from a single wafer W. Hence, the productivity thereof is improved and thus it is advantageous for mass production.

In addition, the growth of the epitaxial thin films on both surfaces of each wafer W can prevent the deformation of the wafer W which is caused by a stress F. That is, in a case of the conventional chemical vapor deposition apparatus in which the epitaxial thin film 80 is grown on only one surface of the wafer W, a strong stress f is applied to the epitaxial thin film 80 to cause a bowing effect in the wafer W. The bowing effect grows more severe as the diameter of the wafer W becomes larger. Consequently, the wafer W may be damaged or its performance may be degraded. However, according to the embodiment of the present invention, since the epitaxial thin films 80 are grown on both surfaces of the wafer W, a stress f generated on the top and bottom surfaces of the wafer W is alleviated, thereby solving the conventional problems. In particular, the wafer W having a large diameter can be manufactured, thereby improving the productivity thereof.

Figure 6A:
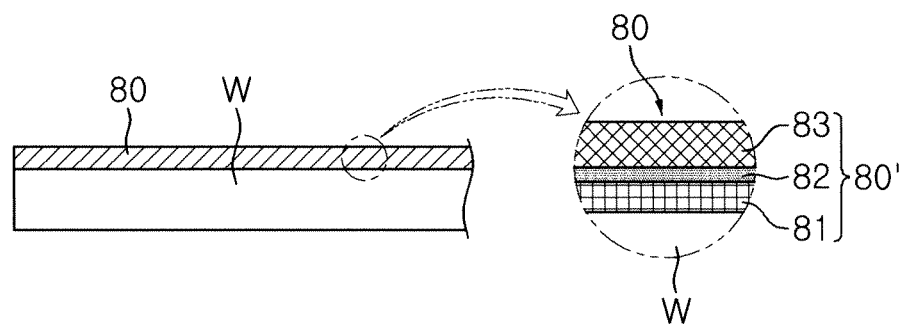
FIGS. 6A and 6B are schematic cross-sectional views illustrating the states of thin films grown on the top surface or the top and bottom surfaces of the wafer in FIGS. 5A through 5D.
Figure 6B:
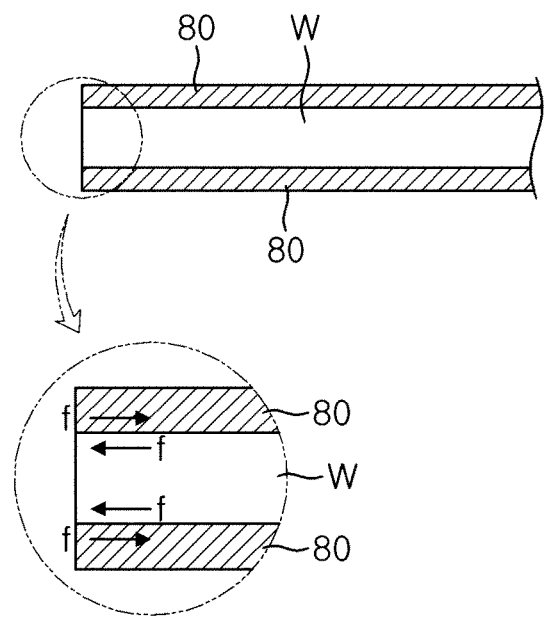

FIGS. 6A and 6B are schematic cross-sectional views illustrating the states of the thin films grown on the top surface or the top and bottom surfaces of the wafer in FIGS. 5A through 5D, and FIG. 7 is a detailed view illustrating the light emitting structure configured with the epitaxial thin films of FIGS. 6A and 6B.

Figure 7:
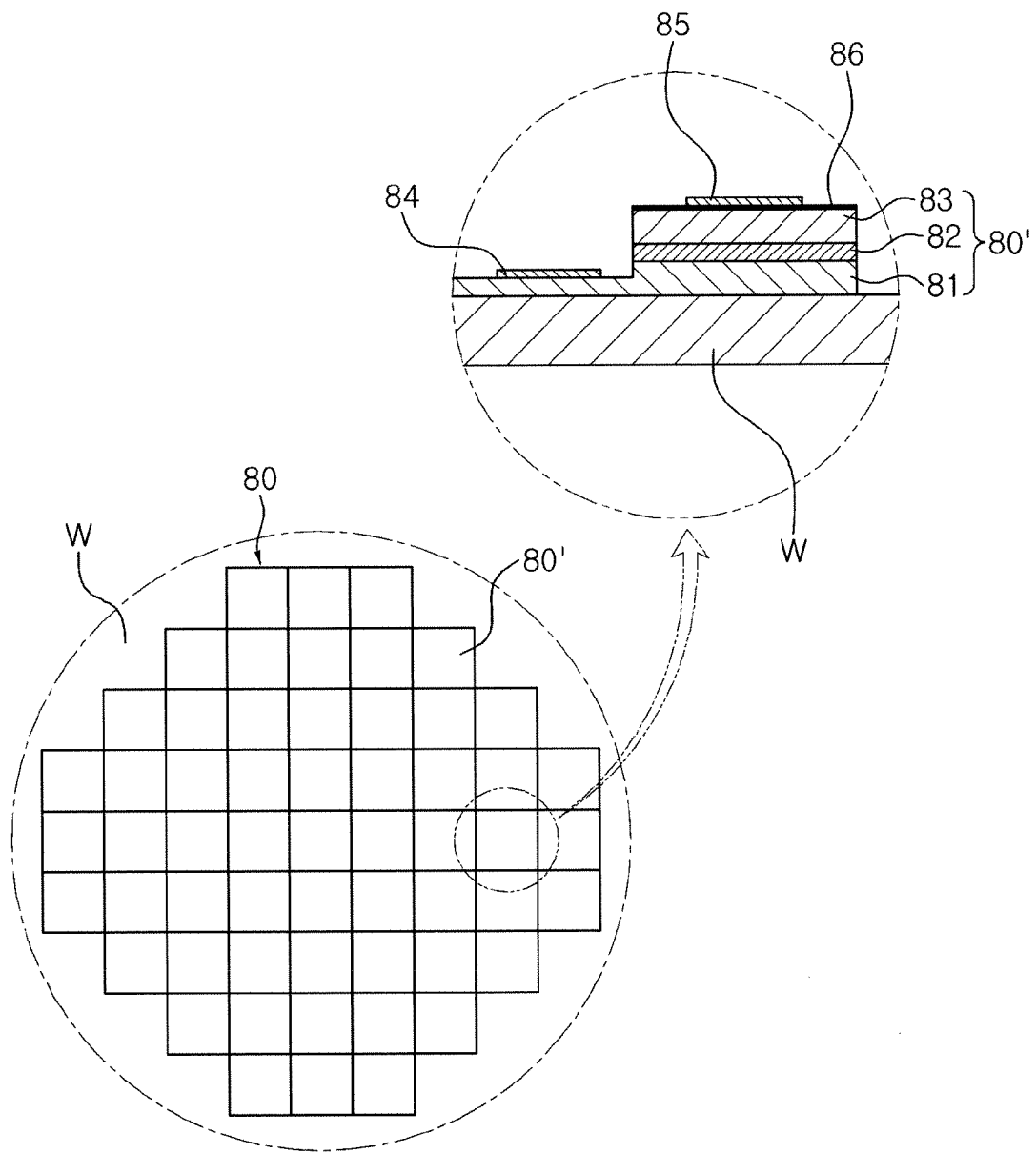
FIG. 7 is a detailed view illustrating a light emitting structure configured with epitaxial thin films of FIGS. 6A and 6B.

As illustrated in FIGS. 6A, 6B and 7, the epitaxial thin film 80 grown on the surface of the wafer W has a light emitting structure 80' in which a first-conductivity-type semiconductor layer 81, an active layer 82, and a second-conductivity-type semiconductor layer 83 are sequentially formed. The light emitting structure 80' may further include a first electrode 84 and a second electrode formed respectively on the first-conductivity-type semiconductor layer 81 and the second-conductivity-type semiconductor layer 83.

The first-conductivity-type semiconductor layer 81 and the second-conductivity-type semiconductor layer 83 may be an n-type semiconductor layer and a p-type semiconductor layer, respectively. The first-conductivity-type semiconductor layer 81 and the second-conductivity-type semiconductor layer 83 may be made of a nitride semiconductor. In this embodiment, the first conductivity type and the second conductivity type may be n-type and p-type, respectively; however, the invention is not limited thereto.

The first-conductivity-type semiconductor layer 81 may be formed of a semiconductor material doped with n-type impurity, which has a composition of $Al_xIn_yGa_{(1-x-y)}N$ ($0 \leq x \leq 1$, $0 \leq y \leq 1$, $0 \leq x+y \leq 1$). As a representative example, the first-conductivity-type semiconductor layer 81 may be formed of GaN, AlGaN, or InGaN. Examples of the impurity doped in the first-conductivity-type semiconductor layer 81 may be Si, Ge, Se, Te, and C.

The active layer 82 formed on the first-conductivity-type semiconductor layer 81 emits light through electron-hole recombination. In general, the active layer 82 has a multi quantum well (MQW) structure in which an InGaN layer serving as a quantum well layer and an (Al)GaN layer serving as a quantum barrier layer are alternately arranged. In a blue light emitting diode, InGaN/GaN is used as the MQW structure. In an ultraviolet light emitting diode, GaN/AlGaN, InAlGaN, and InGaN/AlGaN are used as the MQW structure. Regarding the improvement in the efficiency of the active layer 82, the internal quantum efficiency of the light emitting structure is improved by adjusting the wavelength of light through the change in a composition ratio of In or Al, or by changing the depth of the quantum well layer in the active layer 82, the number of active layers, or the thickness of the active layer.

The second-conductivity-type semiconductor layer 83 may be formed of a semiconductor material doped with p-type impurity, which has a composition of $Al_xIn_yGa_{(1-x-y)}N$ ($0 \leq x \leq 1$, $0 \leq y \leq 1$, $0 \leq x+y \leq 1$). As a representative example, the second-conductivity-type semiconductor layer 83 may be formed of GaN, AlGaN, or InGaN. Examples of the impurity doped in the second-conductivity-type semiconductor layer 83 may be Mg, Zn, and Be.

The first electrode 84 and the second electrode 85 for a current supply are formed on the first-conductivity-type semiconductor layer 81 and the second-conductivity-type semiconductor layer 83, respectively, and are electrically connected to the first-conductivity-type semiconductor layer 81 and the second-conductivity-type semiconductor layer 83, respectively. Accordingly, light can be emitted by supplying the current through the first electrode 84 and the second electrode 85. Specifically, the first electrode 84 may be formed on the first-conductivity-type semiconductor layer 81, a portion of which is exposed by mesa etching. The second electrode 85 may be formed on a transparent electrode layer 86 which is formed on the second-conductivity-type semiconductor layer 83.

The first electrode 84 may be formed on the first-conductivity-type semiconductor layer 81 in a single-layer or a multilayer which is formed of a material selected from the group consisting of Ti, Cr, Al, Cu, and Au.

The second electrode 85 is an outermost electrode layer to be mounted on a lead through wire bonding when a light emitting package will be fabricated by packaging the light emitting structure. The second electrode 85 may be formed of Au or an Au alloy.

The transparent electrode layer 86 may be formed in almost the entire surface of the second-conductivity-type semiconductor layer 83. The transparent electrode layer 86 needs to be formed of a material which can reduce a contact resistance with the second-conductivity-type semiconductor layer 83 having a relatively high energy band gap and also having excellent light transmission properties in order to emit light from the active layer 82 upwardly.

In general, the transparent electrode layer 86 may be provided in a single-layer or a multilayer formed of oxide selected from the group consisting of indium tin oxide (ITO), indium oxide (IO), tin oxide ($SnO_2$), zinc oxide (ZnO), and indium zinc oxide (IZO), which have a relatively high contact resistance but can ensure excellent light transmission properties. The transparent electrode layer 86 can reduce an operating voltage and improve light emission efficiency.

In this embodiment, it has been described that the first-conductivity-type semiconductor layer 81 and the second-conductivity-type semiconductor layer 83 are formed of a nitride semiconductor; however, the invention is not limited thereto. The first-conductivity-type semiconductor layer 81 and the second-conductivity-type semiconductor layer 83 may be formed of an oxide semiconductor.

Modifications of the gas supply unit will be described below with reference to FIGS. 8A through 13.

Figure 8A:
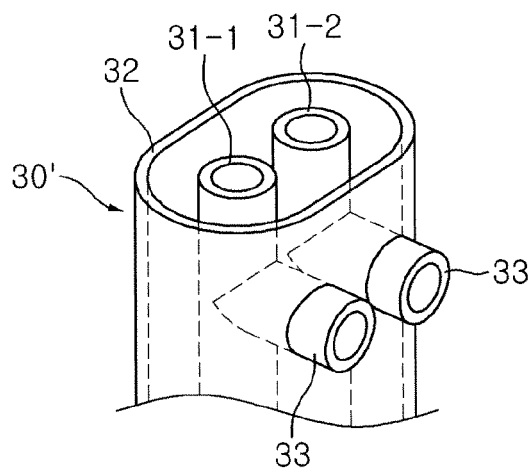
FIGS. 8A and 8B are schematic views illustrating a modification of the gas supply unit of FIG. 1.
Figure 8B:
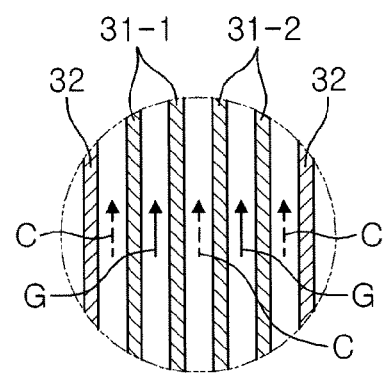
Figure 9:
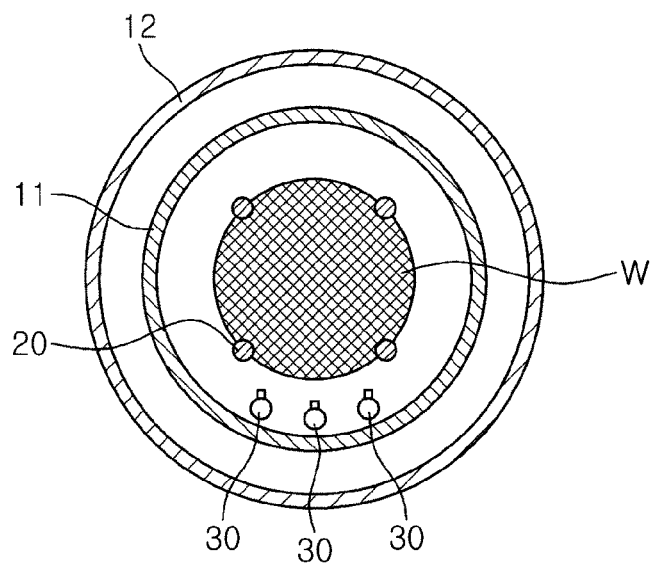
FIGS. 9 and 10 are schematic views illustrating another modification of the gas supply unit of FIG. 1.
Figure 10:
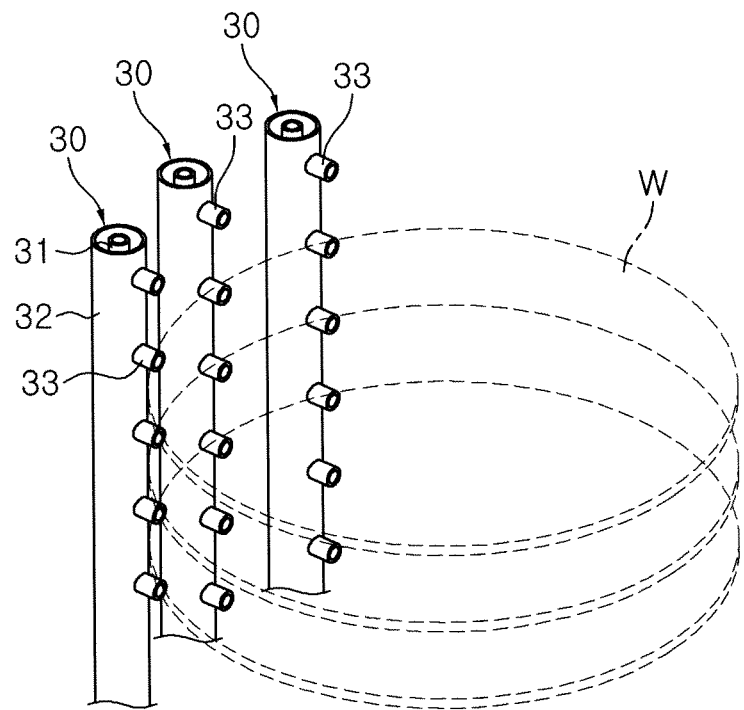
Figure 11:
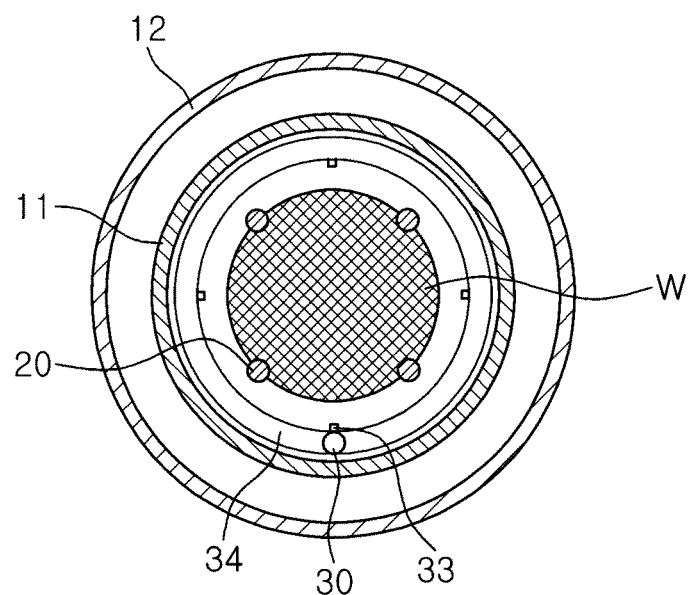
FIGS. 11 through 13 are schematic views illustrating another modification of the gas supply unit of FIG. 1.
Figure 12:
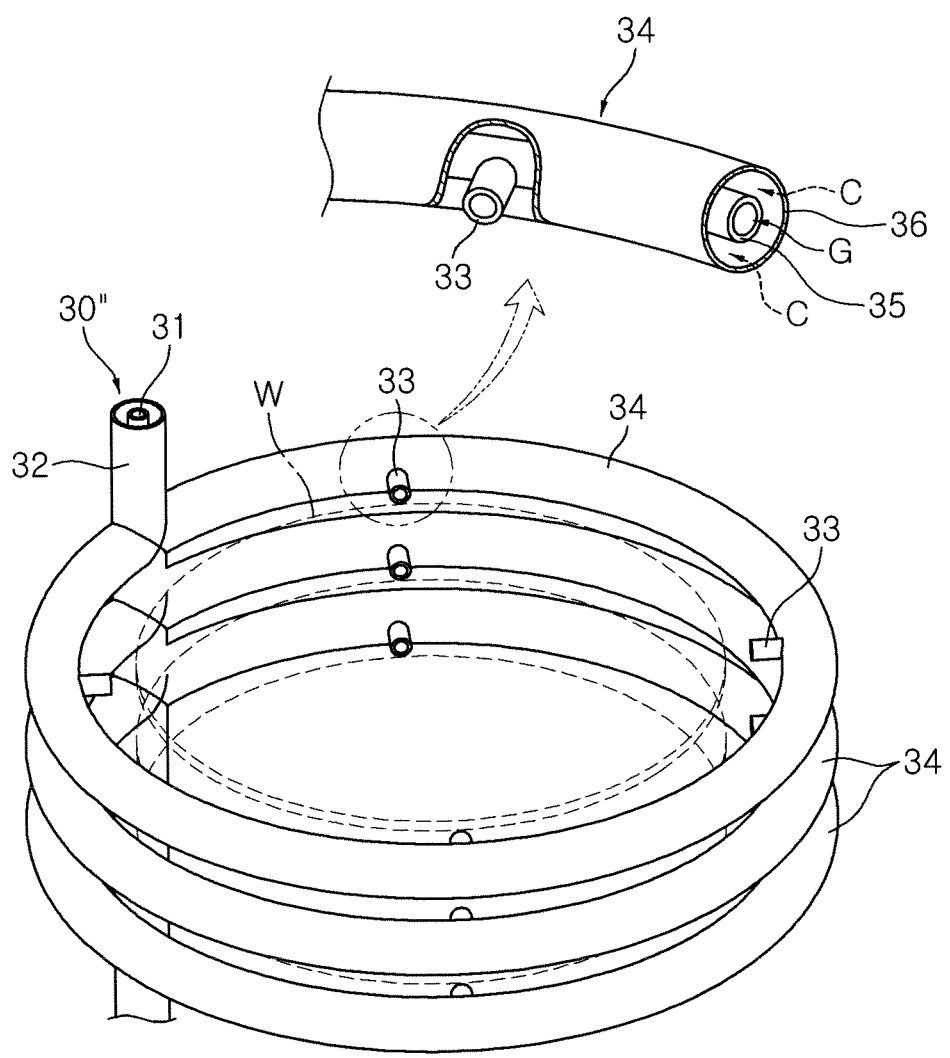
Figure 13:
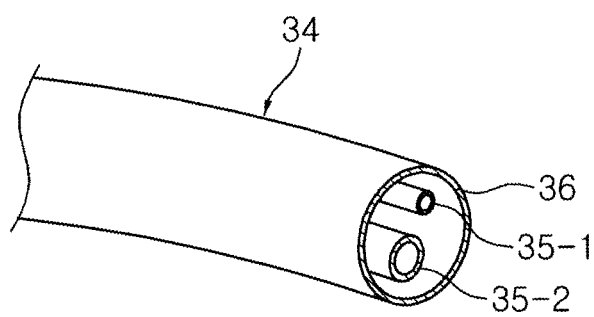

FIGS. 8A and 8B are schematic views illustrating a modification of the gas supply unit of FIG. 1. FIGS. 9 and 10 are schematic views illustrating another modification of the gas supply unit of FIG. 1. FIGS. 11 through 13 are schematic views illustrating another modification of the gas supply unit of FIG. 1.

As illustrated in FIGS. 8A and 8B, a gas supply unit 30' includes a first gas line 31-1 supplying a first reaction gas G1, and a second gas line 31-2 supplying a second reaction gas G2. The first gas line 31-1 and the second gas line 31-2 may be disposed inside a cooling line 32. Specifically, as opposed to the case of FIG. 3 in which the single gas line 31 is provided, at least two gas lines 31-1 and 31-2 may be provided inside the cooling line 32 to separately supply the first reaction gas G1 and the second reaction gas G2. Although two gas lines 31-1 and 31-2 are illustrated, the number of the gas lines may increase according to a kind of the reaction gas.

FIGS. 9 and 10 are schematic views illustrating another modification of the gas supply unit of FIG. 1.

As illustrated in FIGS. 9 and 10, one or more gas supply units 30 are provided to supply the same reaction gas or separately supply different reaction gases. That is, as opposed to the case of FIG. 2 in which the single gas supply unit 30 is provided, two or more gas supply units 30 may be provided to extend between the inner tube 11 and the wafer holder 20 vertically in a wafer W stacking direction. In this case, the gas supply units 30 may separately supply different reaction gases. Each of the gas supply units 30 may include a single gas line 31 as illustrated in FIG. 3, or may include a plurality of gas lines 31-1 and 31-2 as illustrated in FIG. 8.

FIGS. 11 through 13 are schematic views illustrating another modification of the gas supply unit of FIG. 1.

As illustrated in FIGS. 11 through 13, a gas supply unit 30" may further include an auxiliary line 34 which communicates with the gas line 31 and the cooling line 32, is disposed horizontally along the periphery of the wafers W to surround the wafers W, and sprays the reaction gas G. Specifically, the gas supply unit 30" extends between the inner tube 11 and the wafer holder 20 vertically in a wafer W stacking direction, and the auxiliary line 34 extends vertically from the gas supply line 30" to surround the periphery of each wafer W.

The auxiliary line 34 has a ring shape having a diameter greater than that of the wafer W. The auxiliary line 34 may include an auxiliary gas line 35 and an auxiliary cooling line 36. The auxiliary gas line 35 includes a plurality of spray nozzles 33 which communicate with the gas line 31 and spray the reaction gas G supplied from the gas line 31. The auxiliary cooling line 36 is provided around the auxiliary gas line 35 to communicate with the cooling line 32 and allow the coolant C to flow therethrough in order to cool the reaction gas G.

In addition, as illustrated in FIG. 13, the auxiliary line 34 may include a first auxiliary gas line 35-1 supplying the first reaction gas G1, and a second auxiliary gas line 35-2 supplying the second reaction line G2. Thus, the first reaction gas G1 and the second reaction gas G2 can be separately supplied through the first auxiliary line 35-1 and the second auxiliary line 35-2.

The auxiliary line 34 may be disposed between the stacked wafers W or may be disposed corresponding to the stacking intervals of the wafers w so that it faces the side each wafer W.

Hereinafter, a chemical vapor deposition apparatus according to another embodiment of the present invention will be described with reference to FIGS. 14 through 18.

Figure 14A:
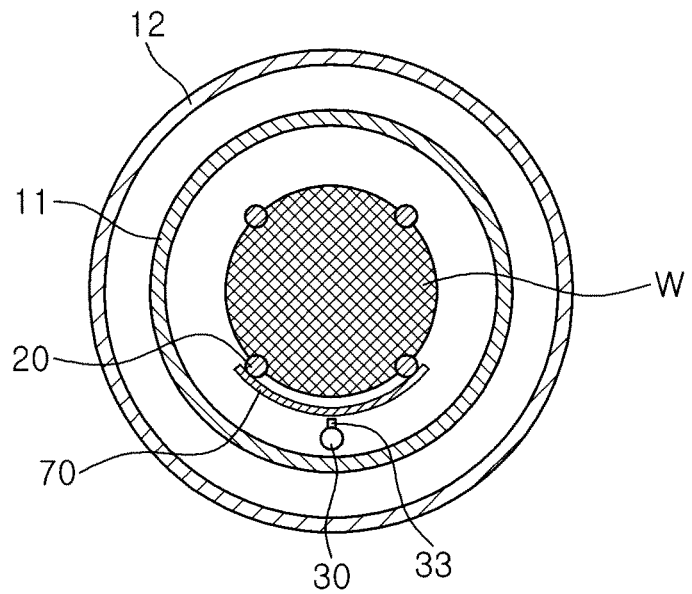
FIGS. 14A and 14B are schematic views illustrating a chemical vapor deposition apparatus according to another embodiment of the present invention.
Figure 14B:
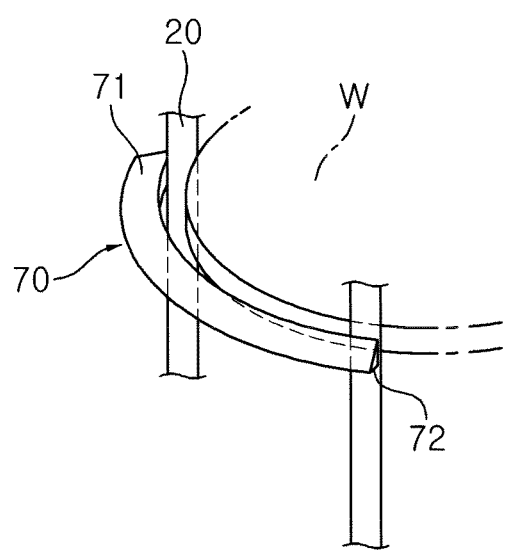
Figure 15:
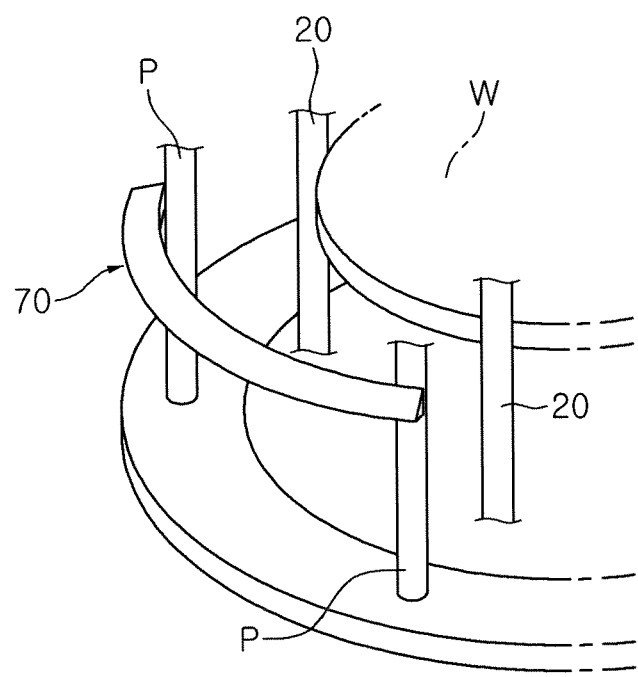
FIG. 15 is a schematic view illustrating a guide unit of FIGS. 14A and 14B.
Figure 16A:
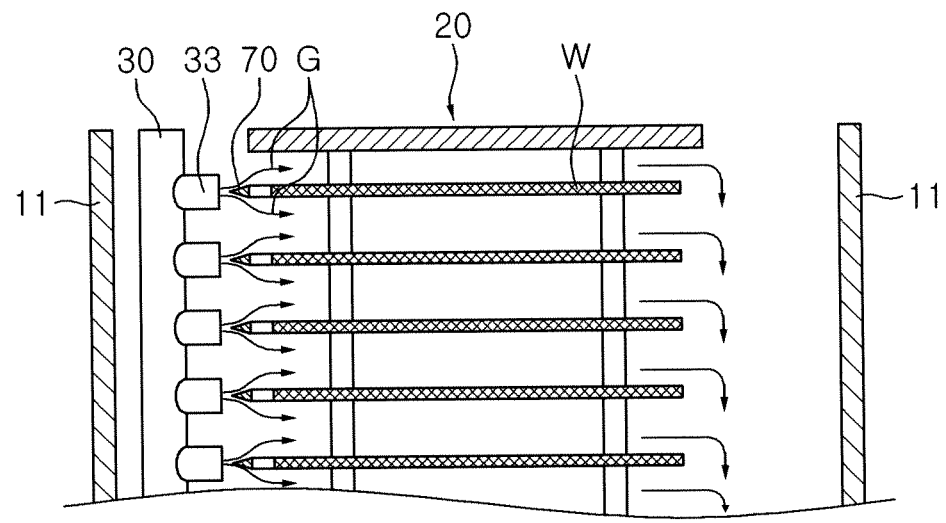
FIGS. 16A and 16B are a cross-sectional view illustrating the guide unit of FIGS. 14A and 14B.
Figure 17:
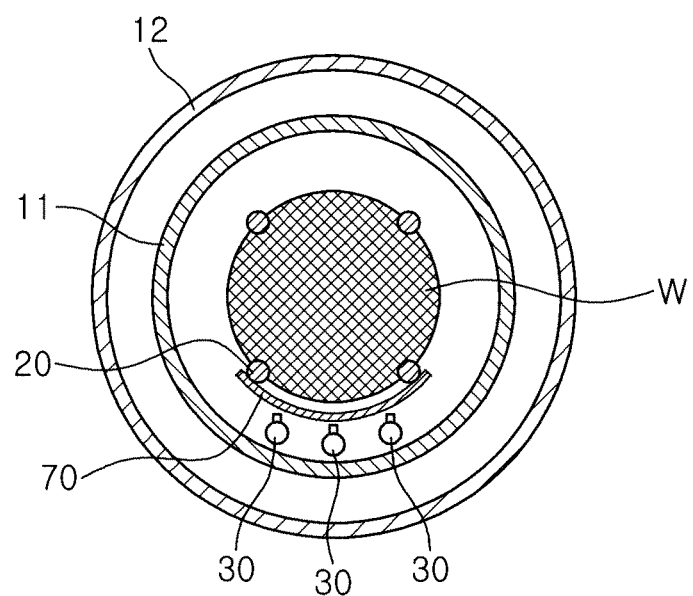
FIGS. 17 and 18 are schematic views illustrating a chemical vapor deposition apparatus according to another embodiment of the present invention.
Figure 18:
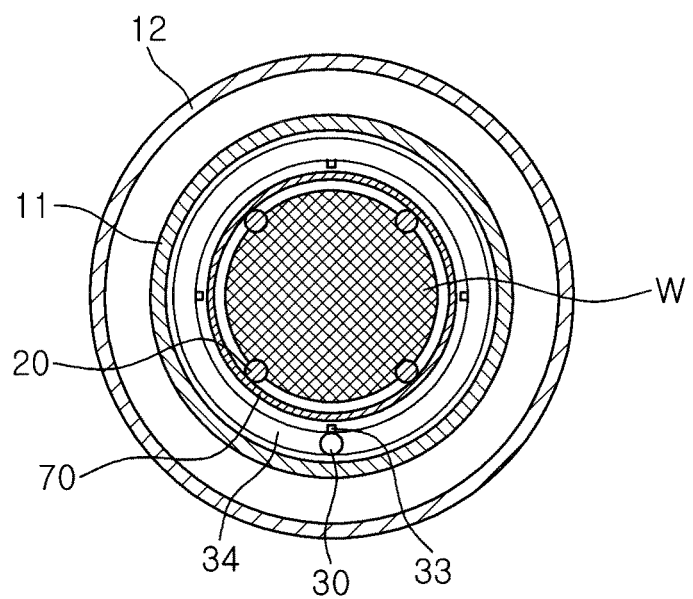

FIGS. 14A and 14B are schematic views illustrating a chemical vapor deposition apparatus according to another embodiment of the present invention. FIG. 15 is a schematic view illustrating a guide unit of FIGS. 14A and 14B, and FIG. 16 is a cross-sectional view illustrating the guide unit of FIGS. 14A and 14B. FIGS. 17 and 18 are schematic views illustrating a chemical vapor deposition apparatus according to another embodiment of the present invention.

The chemical vapor deposition apparatus of FIGS. 14A and 14B has a structure substantially identical to that of FIG. 1. However, the chemical vapor deposition apparatus of FIGS. 14A and 14B further includes a guide unit 70 which guides a flow of a reaction gas sprayed from the spray nozzles. A description overlapped with the embodiment of FIG. 1 will be omitted, and the following description will be focused on the structure of the guide unit 70.

As illustrated in FIGS. 14A and 14B, the guide unit 70 guides the flow of the reaction gas G so that the reaction gas G sprayed from the spray nozzles 33 flows to the top and bottom surfaces of each wafer W. Specifically, the guide unit 70 is disposed between the spray nozzles 33 and the wafers W and has an upper inclined surface 71 and a lower inclined surface 72 which are inclined toward the spray nozzles 33 and contacted together in order to reduce a cross-sectional area in a direction from the wafers toward the spray nozzles 33. Therefore, as illustrated in FIGS. 14A and 14B, the guide unit 70 has a triangular cross-section, and a vertex at which the upper inclined surface 71 and the lower inclined surface 72 are contacted together is directed to the spray nozzle 33.

As illustrated in FIGS. 14A and 14B, the plurality of guide units 70 may extend from the wafer holder 20 toward the spray nozzles 33 and be arranged vertically in a wafer W stacking direction. Specifically, the guide units 70 may be contacted with the outer surface of the wafer holder 20 facing the gas supply unit 30 and integrally formed with the wafer holder 20.

As illustrated in FIG. 15, the guide unit 70 may be arranged vertically in a wafer W stacking direction by at least one pair of support pins P and may be detachably mounted on the wafer holder 20 to face the spray nozzles 33.

The guide unit 70 is disposed corresponding to the arrangement of the spray nozzles 33 spraying the reaction gas G. That is, as illustrated in FIG. 16, in a case in which the plurality of spray nozzles 33 are arranged to face the sides of the stacked wafers W, the guide unit 70 may be vertically arranged corresponding to the stacking intervals of the wafers W, such that the vertex being the front surface of the guide unit 70 faces the spray nozzles 33 and the rear surface faces the sides of the stacked wafers W.

Figure 16B:
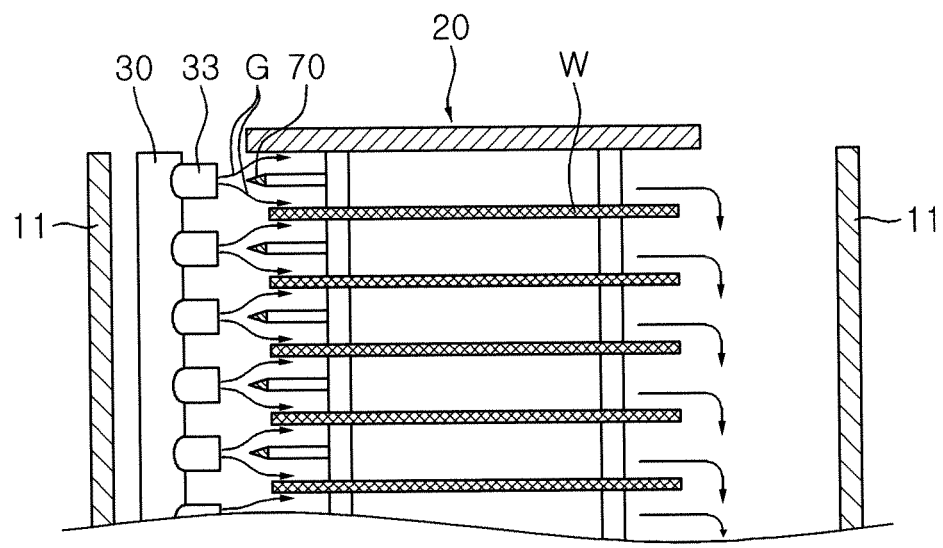

In addition, as illustrated in FIG. 16B, in a case in a case in which the plurality of spray nozzles 33 are arranged between the stacked wafers W, the guide unit 70 may be vertically arranged corresponding to the stacking intervals of the wafers W, such that the guide unit 70 faces the space between the stacked wafers W. Therefore, the reaction gas G sprayed from the spray nozzles 33 is guided to flow along the top and bottom surfaces of each wafer W. Hence, the epitaxial thin films 80 may be grown on the top and bottom surfaces of each wafer W.

When the gas supply unit 30" includes the auxiliary line 34, the guide unit 70 may be provided between the auxiliary line 34 and the wafer holder 20 along the periphery of the wafers W in a ring shape, as illustrated in FIG. 18. That is, the guide unit 70 may have a ring shape having a diameter greater than that of the wafer W and less than that of the auxiliary line 34.

A method of forming a semiconductor epitaxial thin film using the chemical vapor deposition apparatus according to an embodiment of the present invention will be described below with reference to FIGS. 1 through 18.

First, the plurality of wafers W are stacked and mounted on the wafer holder 20, and the wafer holder 20 is loaded into the inner tube 11 of the reaction chamber 10 with the gas supply unit 30. The wafer holder 20 may be loaded into or unloaded from the inner tube 11 through the base plate 13 which can be opened/closed at the lower portion of the inner tube 11.

In this case, the guide unit 70 may be further provided between the gas supply unit 30 and the wafer holder 20 to guide the flow of the reaction gas G sprayed from the gas supply unit 30.

The guide unit 70 may have the upper inclined surface 71 and the lower inclined surface 72 which are inclined toward the gas supply unit 30 and contacted together in order to reduce the cross-sectional area in a direction from the wafer W toward the gas supply unit 30. The guide unit 70 may be vertically arranged corresponding to the stacking intervals of the wafers W, such that it faces the side of each stacked wafer W or faces the space between the stacked wafers W. Since the arrangement of the guide unit 70 has been described above in the chemical vapor deposition apparatus 1, a detailed description thereof will be omitted.

Next, the external reaction gas G is sprayed to the wafers W through the gas supply unit 30 which extends vertically between the inner tube 11 and the wafer holder 20 in a wafer W stacking direction.

The gas supply unit 30 includes at least one gas line 31 supplying the reaction gas G to the reaction chamber 10, and the plurality of spray nozzles 33 communicating with the gas line 31 to spray the reaction gas G to the wafers W. The gas supply unit 30 may further include the cooling line 32 provided around the gas line 31 to allow the coolant C to flow therethrough in order to cool the reaction gas G. The plurality of spray nozzles 33 may be arranged to face the sides of the stacked wafers W, or may be arranged corresponding to the stacking intervals of the wafers W, such that they are disposed between the stacked wafers W. One or more gas supply units 30 may be provided to supply the same reaction gas G or separately supply different reaction gases G.

Next, the reaction gas G sprayed from the gas supply unit 30 is guided to flow to the surface of each wafer W, specifically, along the top surface or the top and bottom surfaces of each wafer W, thereby growing the semiconductor epitaxial thin film 80 on the surface of each wafer W. The semiconductor epitaxial thin film 80 grown on the surface of each wafer W includes the first-conductivity-type semiconductor layer 81, the active layer 82, and the second-conductivity-type semiconductor layer 83 which are sequentially grown, thereby forming the light emitting structure 80'. The first electrode 84 and the second electrode 85 are formed on the first-conductivity-type semiconductor layer 81 and the second-conductivity-type semiconductor layer 83 and electrically connected thereto, respectively. The light emitting structure is singulated into individual devices through a dicing process. In this manner, a plurality of light emitting chips are manufactured.

As such, the chemical vapor deposition apparatus 1 according to the embodiment of the present invention includes the spray nozzles 33 in correspondence with hundreds of sheets of wafers stacked on the wafer holder 20 and sprays the reaction gas G through the spray nozzles 33 to thereby grow the semiconductor epitaxial thin film 80 on the surface of each wafer W.

In addition, the guide unit 70 facing each spray nozzle 33 may be further provided such that the reaction gas sprayed from the spray nozzles 33 is guided to flow to the top and bottom surfaces of each wafer W to thereby grow the epitaxial thin films 80 on the top and bottom surfaces of each wafer W.

Since mass production is realized through the chemical vapor deposition apparatus according to the embodiment of the present invention, the productivity thereof is improved. In particular, even though a large-diameter wafer is used, stress is alleviated by growing the epitaxial thin films on both surfaces of the wafer, thereby preventing the bowing effect of the wafer. Consequently, the wafers having high quality can be provided.

According to exemplary embodiments of the invention, hundreds of sheets of wafers can be stacked on the wafer holder and grown once to thereby realize mass production, as compared to the conventional art in which a few sheets of wafers are mounted on the susceptor.

In addition, when the thin film is grown on the surface of the wafer, it is possible to suppress the wafer bowing effect caused by a difference of a thermal stress and prevent a damage of the wafer, whereby the use of a large-diameter wafer is possible.

Moreover, two semiconductor layers can be obtained from a single wafer by growing the thin films on both surfaces of the wafer, thereby improving the productivity thereof.

While the present invention has been shown and described in connection with the exemplary embodiments, it will be apparent to those skilled in the art that modifications and variations can be made without departing from the spirit and scope of the invention as defined by the appended claims.

What is claimed is:

1. A chemical vapor deposition apparatus comprising:
a reaction chamber including an inner tube having a predetermined volume of an inner space, and an outer tube tightly sealing the inner tube;
a wafer holder disposed within the inner tube and on which a plurality of wafers are stacked at predetermined intervals;
a gas supply unit including at least one gas line supplying an external reaction gas to the reaction chamber, and a plurality of spray nozzles communicating with the gas line to spray the reaction gas to the wafers, whereby semiconductor epitaxial thin films are grown on the surfaces of the wafers; and
a guide unit disposed between the spray nozzles and the wafers, the guide unit guiding the flow of the reaction gas so that the reaction gas sprayed from the spray nozzles flows to the top and bottom surfaces of the respective wafers,
wherein the semiconductor epitaxial thin film grown on the surface of the wafer includes a light emitting structure in which a first-conductivity-type semiconductor layer, an active layer, and a second-conductivity-type semiconductor layer are sequentially formed.

2. The chemical vapor deposition apparatus of claim 1, wherein the gas supply unit extends vertically in a wafer stacking direction, and the plurality of spray nozzles are arranged corresponding to the stacking intervals of the wafers, such that the spray nozzles are arranged at vertical positions facing the sides of the stacked wafers.

3. The chemical vapor deposition apparatus of claim 1, wherein the gas supply unit extends vertically in a wafer stacking direction, and the plurality of spray nozzles are arranged between the stacked wafers.

4. The chemical vapor deposition apparatus of claim wherein the gas supply unit further includes a cooling line provided around the gas line to allow a coolant to flow therethrough in order to cool the reaction gas.

5. The chemical vapor deposition apparatus of claim 4, wherein the gas supply unit includes a first gas line supplying a first reaction gas and a second gas line supplying a second reaction gas, the first gas line and the second gas line being disposed within the cooling line.

6. The chemical vapor deposition apparatus of claim 1, wherein one or more gas supply units are provided to supply the same reaction gas or separately supply different reaction gases.

7. The chemical vapor deposition apparatus of claim 1, wherein the gas supply unit further includes an auxiliary line which communicates with the gas line and the cooling line and sprays the reaction gas, the auxiliary line being disposed horizontally around the periphery of the wafers to surround the wafers.

8. The chemical vapor deposition apparatus of claim 7, wherein the auxiliary line has a ring shape having a diameter greater than that of the wafer, the auxiliary line includes:
an auxiliary gas line including a plurality of spray nozzles which communicate with the gas line and spray the reaction gas supplied from the gas line; and
an auxiliary cooling line provided around the auxiliary gas line to communicate with the cooling line and allow a coolant to flow therethrough in order to cool the reaction gas.

9. The chemical vapor deposition apparatus of claim 8, wherein the auxiliary line includes a first auxiliary gas line supplying a first reaction gas, and a second auxiliary gas line supplying a second reaction line.

10. The chemical vapor deposition apparatus of claim 7, wherein the auxiliary line is disposed between the stacked wafers or arranged corresponding to the stacking intervals of the wafers to face the sides of the wafers.

11. The chemical vapor deposition apparatus of claim 1, wherein the guide unit is disposed between the spray nozzles and the wafers and has an upper inclined surface and a lower inclined surface which are inclined toward the spray nozzles and contacted together in order to reduce a cross-sectional area in a direction from the wafers toward the spray nozzles.

12. The chemical vapor deposition apparatus of claim 1, wherein the guide unit is vertically arranged corresponding to the stacking intervals of the waters to face the sides of the stacked wafers.

13. The chemical vapor deposition apparatus of claim 1, wherein the guide unit is vertically arranged corresponding to the stacking intervals of the wafers to face a space between the stacked wafers.

14. The chemical vapor deposition apparatus of claim 1, wherein the guide unit extends from the wafer holder toward the spray nozzles and is arranged vertically in a wafer stacking direction.

15. The chemical vapor deposition apparatus of claim 1, wherein the guide unit is arranged vertically in a wafer stacking direction by at least one pair of support pins and is detachably mounted on the wafer holder to face the spray nozzles.

16. The chemical vapor deposition apparatus of claim 1, further comprising a rotation driving unit connected to the wafer holder to rotate the wafer holder.

17. The chemical vapor deposition apparatus of claim 1, wherein the light emitting structure further includes a first electrode formed on the first-conductivity-type semiconductor layer, and a second electrode formed on the second-conductivity-type semiconductor layer.

18. The chemical vapor deposition apparatus of claim 17, wherein the first electrode is formed on the first-conductivity-type semiconductor layer, a portion of which is exposed by mesa etching, and the second electrode is formed on a transparent electrode layer which is formed on the second-conductivity-type semiconductor layer.

19. The chemical vapor deposition apparatus of claim 4, wherein the gas line is disposed inside the cooling line to allow a coolant flowing through the cooling line to cool the reaction gas flowing through the gas line.

\* \* \* \* \*